United States Patent [19]

Stejskal

[11] 4,446,430
[45] May 1, 1984

[54] SAMPLE SPINNER FOR NUCLEAR MAGNETIC RESONANCE SPECTROMETER

[75] Inventor: Edward O. Stejskal, St. Louis, Mo.

[73] Assignee: Monsanto Company, St. Louis, Mo.

[21] Appl. No.: 297,594

[22] Filed: Aug. 31, 1981

[51] Int. Cl.³ ............................................. G01R 33/08
[52] U.S. Cl. ...................................... 324/321; 324/318
[58] Field of Search ................................. 324/300, 321

[56] References Cited

U.S. PATENT DOCUMENTS

| | | | |
|---|---|---|---|
| 2,960,649 | 11/1960 | Bloch | 324/321 |
| 3,681,683 | 8/1972 | Huber | 324/321 |
| 3,746,971 | 7/1973 | Storey | 324/321 |
| 3,911,355 | 10/1975 | Leane | 324/321 |
| 4,088,944 | 5/1978 | Engler et al. | 325/0.5 |
| 4,201,941 | 5/1980 | Fyfe | 324/321 |
| 4,246,537 | 1/1981 | Laukien | 324/321 |
| 4,254,373 | 3/1981 | Lippmaa | 324/321 |
| 4,275,350 | 6/1981 | Hill | 324/321 |

OTHER PUBLICATIONS

"Sideways-Spinning 20-mm-Tube Probe for Widebore Superconducting Magnet Spectrometer Systems", J. Magnetic Resonance 31, 327-335 (1978).
"A High-Speed Magic Angle Spinner", J. Magnetic Resonance 30, 563-570 (1978), K. W. Zilm, D. W. Alderman, and D. M. Grant.
"A Magic-Angle Rotor for NMR Using a Forced Gas Bearing", Giovanni Balimann, et al.
"High-Speed Rotors for Nuclear Magnetic Resonance Studies on Solids", J. Magnetic Resonance 1, 27-34 (1969), E. R. Andrew, L. F. Farnell, M. Firth, T. D. Gledhill, and I. Roberts.
"A Magic-Angle Spinning System for Bullet-Type Rotors in Electromagnets", J. Magnetic Resonance 42, 312-321 (1981), Victor J. Bartuska and Gary E. Maciel.
"Quick Sample Change Probe for Magic-Angle-Spinning NMR in a Superconducting Magnet, J. Magnetic Resonance 37, 00-00 (1980).
"The Design of High Speed Cylindrical NMR Sample Spinners", F. David Doty and Paul D. Ellis.
"Deutrium NMR in Solids with a Cylindrical Magic Angle Sample Spinner, J. Magnetic Resonance 41, 440-446 (1980), R. Eckman, M. Alla, and A. Pines.
Private Communication.

Primary Examiner—Michael J. Tokar
Attorney, Agent, or Firm—Joseph D. Kennedy; Larry R. Swaney

[57] ABSTRACT

A sample spinner for a nuclear magnetic resonance spectrometer having improved operating characteristics is described comprising a rotor supported at both ends by support gas bearings and positioned by a thrust gas bearing. Improved support gas bearings are also described which result in a spinner exhibiting long-term stable operation characteristics.

10 Claims, 2 Drawing Figures

SAMPLE SPINNER FOR NUCLEAR MAGNETIC RESONANCE SPECTROMETER

This invention relates to nuclear magnetic resonance (NMR) spectrometers and more particularly to sample spinners suitable for double-resonance experiments.

BACKGROUND OF THE INVENTION

For NMR analysis of solids, it is necessary to rotate the sample at high frequencies (1–20 Kilohertz) in order to obtain a meaningful spectrum. Spinner operation has been of continuing concern because of the tendency of spinner instability and the difficulty of controlling within close limits the orientation of the spinning axis. The present invention involves the use of air bearings which increase rotor stability and reduces wear to rotor parts.

SUMMARY OF THE INVENTION

In accordance with this invention, an improved NMR sample spinner is provided which comprises a stator and a gas turbine driven rotor having a center cavity adapted to hold a sample. The stator has a chamber to accommodate the rotor which operatively fits the cylindrical body of the rotor to form a gas turbine portion, support gas bearing portions, and thrust gas bearing portion. The stator contains gas-carrying channels for feeding gas to the gas turbine portion, the support gas bearing portions and the thrust gas bearing portion. The rotor contains a plurality of turbine flutes radially positioned around the outside surface of the rotor body opposite the turbine drive gas channel of the stator. A gas stream impinging against the turbine flutes imparts rotory motion to the rotor. The rotor is supported at both ends by support gas bearings and is positioned by a thrust gas bearing. This permits smoother, more stable operation since the two support gas bearings give better rotor alignment and the thrust gas bearing eliminates (or greatly reduces) frictional contact between the rotor and stator.

A thrust gas bearing comprises a gas stream fed through an orifice essentially centered on the rotor axis and impinging against the end of the rotor which forms a plate member which lies in a plane essentially normal to the rotor axis. The gas stream which exhausts at the peripheral edge of the rotor provides a space between the stator and rotor and thereby eliminates or greatly reduces frictional contact between the two spinner members. The thrust gas stream also holds the rotor in place. The rotor is simply inserted into the stator chamber and the thrust gas stream holds it in position either when the rotor is spinning or motionless. The rotor is removed by turning off the thrust gas which permits the rotor to drop from the chamber.

A support gas bearing comprises a gas stream fed through a plurality of orifices radially positioned around the inside surface of the stator body and impinging against the outside surface of the rotor. The gas stream provides a space between the stator and rotor and maintains the rotor alignment. The gas stream exhausts at the edges of the gas-carrying channel portion of the stator. The rotor surface and the opposing surface of the support gas bearing portion of the stator form the inner race and outer race portions of the support bearing.

Another feature of the invention is the provision for replaceable inner and outer races for the support gas bearings. This permits replacement of worn races and avoids replacement of the entire rotor. Preferably, the replaceable inner and outer races are made from a non-magnetic abrasion resistant material and, more preferably, a material having a low coefficient of friction. Especially preferred is an inner race made from a material stronger and stiffer than the rotor body material thereby providing added reinforcement to the rotor body. When the inner race is made of polymeric material, the outer race can be made of a non-magnetic electrically conductive metal which metal will shield the nuclear magnetic resonance of the race material and thereby eliminate interference with the NMR of the sample being analyzed.

Another feature of the invention is providing an orifice in the outer race having a larger diameter than the orifice from the channel supplying the gas to the support bearing. The larger diameter orifice within the outer race provides a surge volume which dampens pneumatic fluctuations within the system which in turn leads to more stable rotor operation.

These and other features of the invention will become more apparent by referring to the drawings and descriptions therof.

BRIEF DESCRIPTIONS OF THE DRAWINGS

DESCRIPTIONS OF THE PREFERRED EMBODIMENTS

Figure 1:
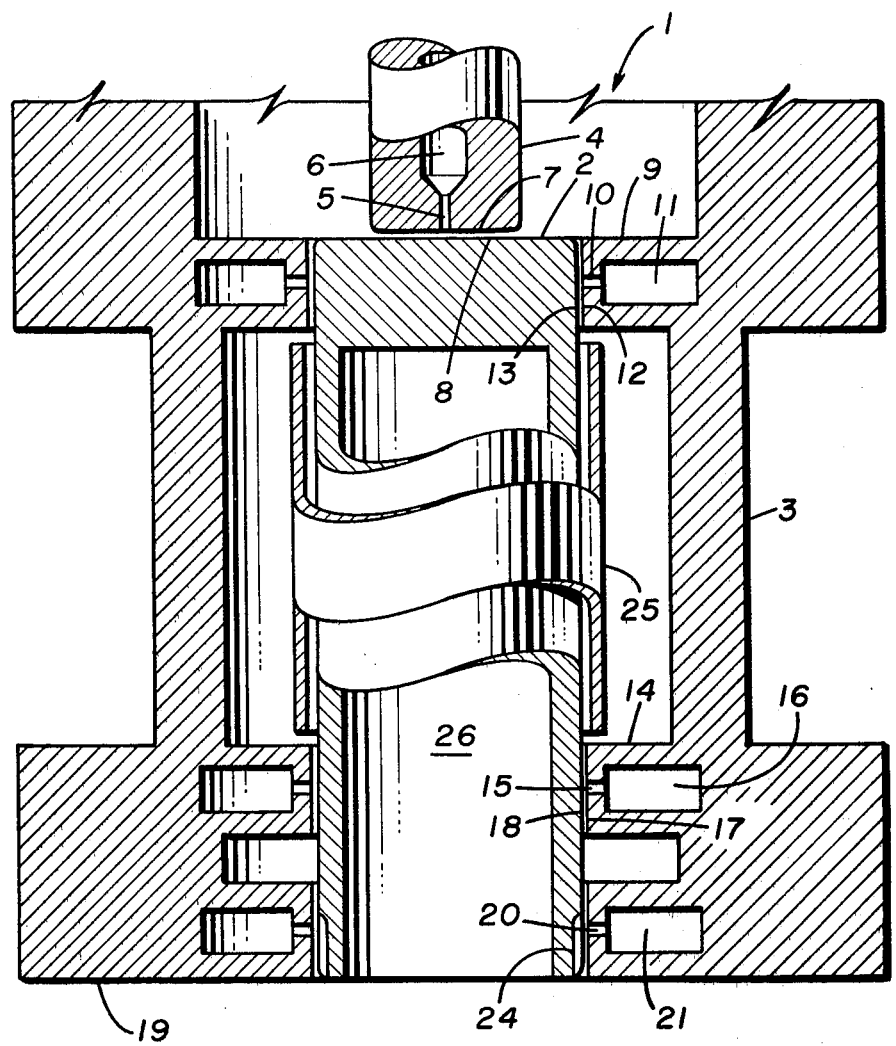
FIG. 1 is a side view of the spinner of the invention.

Referring to FIG. 1, there is shown an NMR sample spinner 1 of the invention. Sample spinner 1 comprises rotor 2 and stator 3. Rotor 2 contains cavity 26 for holding a sample and a cap (not shown) for keeping the sample in place. Independent from spinner 1 but shown is the sample coil 25 for transmitting and receiving NMR signals from the sample under analysis. Stator 3 comprises thrust gas bearing portion 4, support gas bearing portions 9 and 14, and gas turbine portion 19. Thrust gas bearing portion 4 contains channel 6 through which a gas is fed through orifice 5 which is essentially centered on the rotor axis. The gas stream from orifice 5 impinges on rotor plate 8 which lies in a plane essentially normal to the rotor axis. During operation, sufficient gas is supplied through orifice 5 to maintain a space between rotor plate 8 and opposite essentially parallel face 7 of thrust gas bearing portion 4.

Support gas bearing portion 9 contains channel 11 through which a gas is fed through orifice 10. The gas stream from orifice 10 impinges on inner race portion 13 of rotor 2. A number of orifices as illustrated by orifices 10, for example, from 4 to 30 or more, is radially situated around stator 3. Typically, 8 or 20 orifices are equally spaced around rotor 2. In operation, a sufficient quantity of gas is supplied through these orifices to maintain a space between inner race 13 and outer race 12 of support gas bearing portion 9.

Support gas bearing portion 14 contains channel 16 and orifice 15 which support gas bearing is operated as described above to maintain a space between inner race 18 and outer race 17. By proper regulation of the gas pressure in channels 11 and 16, low friction support of rotor 2 in respect to stator 3 is obtained.

Gas turbine portion 19 contains channel 21 through which a gas is fed through orifice 20. A gas stream fed through a plurality of orifices, as illustrated by orifice 20, impinges turbine flutes, as illustrated by flute 24 which is recessed into the body of rotor 2. The rate at which the supply of gas is fed through the gas turbine orifices determines the speed of rotation of rotor 2.

Figure 2:
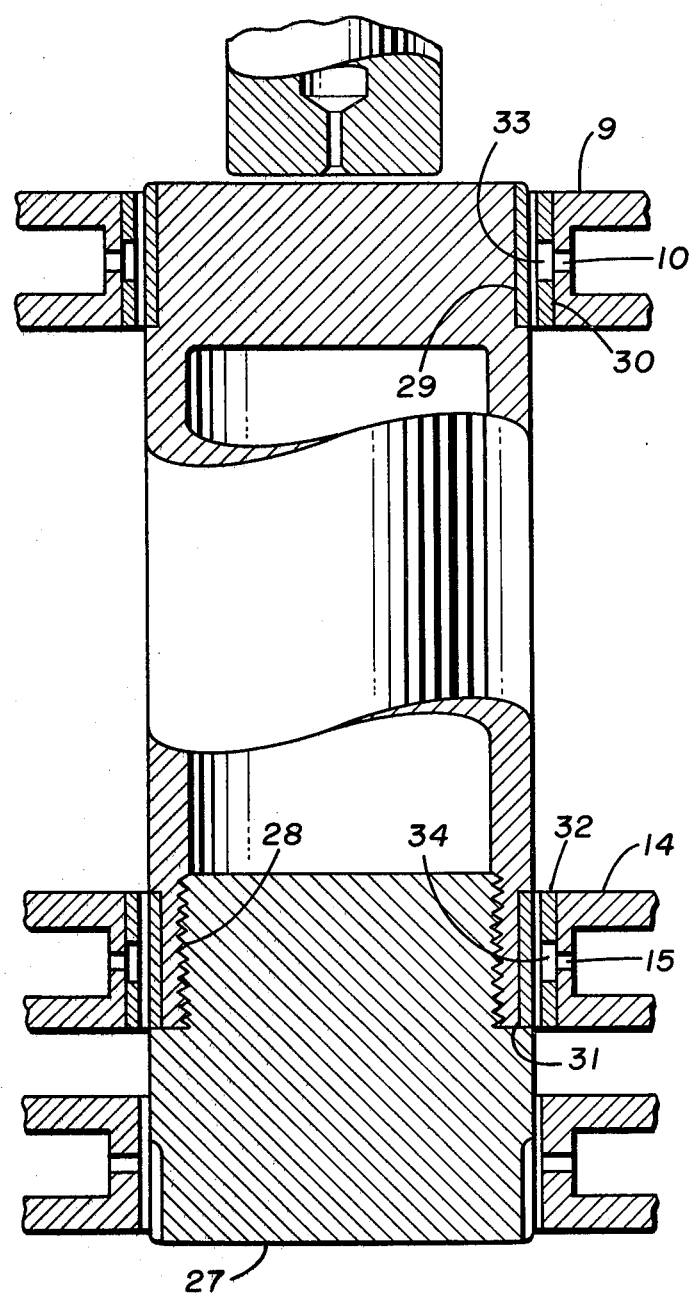
FIG. 2 is a detailed diagram illustrating support bearing gas portions of the spinner of the invention.

An improved support gas bearing illustrative of embodiments of the invention is shown in FIG. 2. Support gas bearing portion 9 contains orifice 10. The remainder of the support gas bearing comprises replaceable inner race 29 and replaceable outer race 30. During start-up and stopping of the rotor, there can be periods of instability during which the rotor may wobble which can cause contact between the rotor and stator in the vicinity of the support bearings leading to excessive wear. By providing replaceable races 29 and 30 when excessive wear occurs, the races may be replaced without replacing the entire rotor. Inner race 29 and outer race 30 may be made from a material of greater abrasion resistance than the material from which the rotor and stator are made. Preferably, inner race 29 and outer race 30 can also be made from a material having a low coefficient of friction. A low friction material reduces the drag and minimizes the disruptive nature of the contacts when they occur. An abrasive resistant material reduces wear and improves durability.

Examples of suitable race materials are non-magnetic metals, for example, copper or copper alloys such as brass or bronze and polymeric material, for example, poly(oxymethylene) (Delrin) or graphite-filled polyimide. Another advantage of having inner race 29 made from a material different from the material of the rotor is a stronger material can be selected to provide reinforcement to the rotor body. For example, a rotor body made from a fluoropolymer (Kel-F) tends to grow in diameter due to centripetal forces and the poor creep resistance of the polymer which can eventually led to failure of the rotor either by disintegration or by binding with the stator. An inner race of stronger material (such as any of the race materials illustrated above) reinforces the rotor body and eliminates or greatly reduces the growth of the rotor diameter which results in a rotor assembly having longer life. Whenever inner race 29 is made from an organic polymeric material, outer race 30 may be made from an electrically-conductive metal to shield the nuclear magnetic resonance of said polymeric material and thereby eliminate interference with the sample NMR.

Support gas bearing portion 14 contains orifice 15 and outer race 32. Inner race 31 is held in place by threads 28 of removable gas turbine portion 27.

Orifices 33 and 34 of outer races 30 and 32, respectively, are important since they provide a damping chamber which stabilizes rotor operation. The diameters of orifices 33 and 34 (and others not shown) are larger then the diameters of orifices 10 and 15. This provides a reservoir for the bearing gas and cushions pneumatic upsets caused by rotor wobble. Generally, the orifice diameter of the outer race is 50% or more greater than the orifice diameter of the channel orifice. Preferably the outer race orifice diameter is at least twice the diameter of the channel orifice.

A spinner having a rotor made of poly(chlorotrifluoroethylene), Kel-F, and having a diameter of about 10.8 millimeters and a sample capacity of about 0.7 cubic centimeters with graphite-filled polyimide (Vespel) bearing races is operated using air up to speeds of about 3.0 kilohertz with repeated stable operation over long periods of time.

Although the invention has been illustrated by typical examples, it is not limited thereto. Changes and modifications of the examples of the invention herein chosen for purposes of disclosure can be made which do not constitute departure from the spirit and scope of the invention.

The embodiments of the invention in which an exclusive property or privilege is claimed are defined as follows:

1. A NMR spectrometer sample spinner comprising a stator and a gas-driven rotor having a center cavity adapted to hold a sample, which stator and rotor contain a gas turbine portion, support gas bearing portions, and a thrust gas bearing portion, said stator having a chamber to accommodate the rotor and gas-carrying channels for feeding gas to the gas turbine portion, the support gas bearing portions and thrust gas bearing portion, said rotor comprising a cylindrical body which operatively fits the stator chamber and contains a plurality of flutes radially positioned around the outside surface of the body opposite the turbine drive gas channel of the stator, which rotor is supported at both ends by support gas bearings and is positioned by a thrust gas bearing, in which the thrust gas bearing comprises a gas stream fed through an orifice impinging against the end of the rotor, providing a space between the stator and rotor and holding the rotor in place whether spinning or motionless.

2. The spinner of claim 1 in which the thrust gas bearing comprises a gas stream fed through an orifice essentially centered on the rotor axis and impinging against a rotor plate member which member lies in a plane essentially normal to the rotor axis.

3. The spinner of claim 2 in which the support gas bearings comprise a gas stream fed through a plurality of orifices radially positioned around the inside surface of the stator body and impinging against the outside surface of the rotor.

4. The spinner of claim 3 in which the support gas bearing portions comprise an inner race on the rotor and opposite therefrom an outer race on the stator.

5. The spinner of claim 4 in which the inner and outer races are replaceable and are made from non-magnetic abrasion resistant material.

6. The spinner of claim 5 in which the inner race reinforces the rotor body.

7. The spinner of claim 6 in which the rotor body is made from poly(chlorotrifluoroethylene).

8. The spinner of claim 7 in which the inner races of the support gas bearings are made from graphite-filled polyimide or poly(oxymethylene).

9. The spinner of claim 5 in which the area of the orifices of the outer race are larger than the area of the gas-carrying channels which feed the orifices.

10. The spinner of claim 9 in which the inner race is made of polymeric material and the outer race is made of electrically-conductive metal effectively shielding the nuclear magnetic resonance of said polymeric material.

* * * * *